(12) United States Patent
Wolfe et al.

(10) Patent No.: US 7,902,834 B2
(45) Date of Patent: Mar. 8, 2011

(54) UPGRADABLE TEST SET

(75) Inventors: Gregory R. Wolfe, Royersford, PA (US); Peter H. Merl, Warminster, PA (US); Warren G. Southard, Norristown, PA (US)

(73) Assignee: AVO Multi-Amp Corporation, Dallas, TX (US)

( * ) Notice: Subject to any disclaimer, the term of this patent is extended or adjusted under 35 U.S.C. 154(b) by 494 days.

(21) Appl. No.: 12/114,379

(22) Filed: May 2, 2008

(65) Prior Publication Data
US 2009/0273336 A1    Nov. 5, 2009

(51) Int. Cl.
*H01H 31/02* (2006.01)
*G01R 31/02* (2006.01)
*G01R 31/14* (2006.01)

(52) U.S. Cl. .................. 324/555; 324/537; 702/117

(58) Field of Classification Search .................. 324/537, 324/500, 555, 546, 547, 76.11; 702/108, 702/117, 120
See application file for complete search history.

(56) References Cited

U.S. PATENT DOCUMENTS

| | | | |
|---|---|---|---|
| 5,336,988 A * | 8/1994 | Chmielewski et al. | 324/76.19 |
| 5,479,610 A * | 12/1995 | Roll-Mecak et al. | 714/25 |
| 6,300,772 B1 * | 10/2001 | Brown et al. | 324/555 |
| 6,377,051 B1 * | 4/2002 | Tyner et al. | 324/418 |
| 6,549,017 B2 * | 4/2003 | Coffeen | 324/547 |
| 6,788,077 B2 * | 9/2004 | Hamdan | 324/726 |
| 6,975,965 B2 * | 12/2005 | Jager et al. | 702/182 |
| 7,681,079 B2 * | 3/2010 | Xu et al. | 714/25 |

* cited by examiner

*Primary Examiner* — Hoai-An D Nguyen
(74) *Attorney, Agent, or Firm* — Conley Rose, P.C.; J. Robert Brown, Jr.

(57) ABSTRACT

An upgradeable test set is that includes a stimulator circuit to transmit test signals to an electrical equipment under test, a coupling to removeably couple at least the stimulator circuit to one of a plurality of front-end interfaces. The plurality of front-end interfaces include a first front-end interface having a first display and a first input device and a second front-end interface having a second display and a second input device. The first display and the second display have different display characteristics, and the first input device and the second input device have different characteristics. The one of the front-end interfaces communicates a test control parameter to the stimulator circuit and a response of the electrical equipment under test is communicated to the one of the front-end interfaces. The case is configured to enclose the stimulator circuit, the one of the front-end interfaces, and the coupling.

24 Claims, 4 Drawing Sheets

Test Set

UPGRADABLE TEST SET

CROSS-REFERENCE TO RELATED APPLICATIONS

None.

STATEMENT REGARDING FEDERALLY SPONSORED RESEARCH OR DEVELOPMENT

Not applicable.

REFERENCE TO A MICROFICHE APPENDIX

Not applicable.

BACKGROUND

The electrical power system in the United States generates three-phase alternating current (AC) electrical power. Each power phase is 120 degrees out of phase, plus or minus, with the other two power phases. The voltage of any phase oscillates sinusoidally between positive voltage and negative voltage. It happens that three-phase power distribution provides an acceptable compromise between electrical generation and distribution efficiency and the expense and complexity of power distribution equipment.

It is more efficient to transmit electrical power at high voltage levels than at low voltage levels. Electrical power may be generated as three-phase AC power at moderate voltage levels in the 12 thousand volt (kV) to 25 kV range. The voltage level may stepped up to the 110 kV to 1000 kV range using a transformer for transmission over long transmission lines, hence minimizing transmission line power loss. The transmission line voltage may be stepped down, using a transformer at a substation, to the 12 kV to 35 kV range for local distribution. The local distribution voltage level may be further stepped down through one or more transformer stages to provide 120 volt AC power to the home and office. Special accommodations may be made for manufacturing plant electrical power consumers.

Power distribution transformers may comprise three pairs of wire windings, one pair of windings for each phase. Each pair of wire windings is constructed so that an alternating electric current in a primary winding creates a fluctuating electromagnetic field that couples into the secondary winding, thereby inducing a corresponding alternating electric current in the secondary winding. Typically the primary and secondary windings are wound on a common core that improves the efficiency of the transformer by concentrating the electro-magnetic field within the common core, thereby improving the coupling between the primary and secondary windings. The voltage in the secondary winding is proportional to the voltage in the primary winding, and the current in the secondary winding is inversely proportional to the current in the primary winding, where the proportionality in both cases is based on the ratio of the number of turns of wire in the secondary winding to the number of turns of wire in the primary winding. This ratio is referred to as the turns ratio. The performance of power distribution transformers may change as insulation of the windings deteriorates, as resistance of the winding wires changes over time or with temperature, as physical properties of the common core changes over time, and other. The ratio of number of turns in the secondary winding and the number of turns in the primary winding may change if a turn shorts at a point of insulation breakdown. A wide variety of power distribution transformer configurations is known, and some transformers may vary somewhat from the general description above. Some transformers may be auto-transformers. Some transformers may have taps.

Testing of power distribution transformers may be conducted by connecting a test set to the windings of the power distribution transformers and exciting the primary winding and the secondary winding with electrical signals, both direct current and alternating current. Testing may be conducted on one transformer phase at a time, or may be conducted on multiple transformer phases concurrently. Testing may include determining a primary to secondary windings ratio or turns ratio, a winding resistance, a winding frequency response, and other test parameters. From some points of view, testing generators has some similarities to testing transformers. An exciter winding in a generator may be considered to be similar, in some respects, to a transformer winding. The windings of a generator may be considered to be similar, in some respects to a transformer winding. Transporting the power distribution transformer or generator to a controlled test laboratory environment may not be economically feasible, and therefore testing typically occurs on site, often outdoors in variable weather conditions. As can readily be appreciated by one skilled in the power distribution art, the testing environment associated with high voltage power distribution transformers may be subject to intense electric field fluxes as well as high levels of air borne dust and grit.

SUMMARY

In an embodiment, an upgradeable test set is provided. The upgradeable test set comprises a stimulator circuit to transmit test signals to an electrical equipment under test, a coupling to removeably couple at least the stimulator circuit to one of a plurality of front-end interfaces, and a case. The plurality of front-end interfaces include a first front-end interface having a first display and a first input device and a second front-end interface having a second display and a second input device. The first display and the second display have different display characteristics, and the first input device and the second input device have different characteristics. The one of the front-end interfaces communicates a test control parameter to the stimulator circuit and a response of the electrical equipment under test is communicated to the one of the front-end interfaces. The case is configured to enclose the stimulator circuit, the one of the front-end interfaces, and the coupling.

In another embodiment, a power distribution equipment test set is provided. The power distribution equipment test set comprises a test signal generator and a first field replaceable control panel. The test signal generator transmits known test signals to the equipment under test, the test signal based on a test control parameter. The first field replaceable control panel is configured to receive inputs including the test control parameter, to send the test control parameter to the test signal generator, and to display test results.

In still another embodiment, a method of testing an electrical power distribution equipment is provided. The method comprises coupling a signal generation portion of a test set to an electrical power distribution equipment unit and inputting a test control parameter into a first upgradeable front-end of the test set. The method also comprises transmitting a first test signal from the signal generation portion of the test set to the electrical power distribution equipment based on the test control parameter input into the first upgradeable front-end and analyzing a first response to the first test signal received by the signal generation portion of the test set from the electrical power distribution equipment to determine a first test result.

The method may also comprise displaying the first test result on the first upgradeable front-end. The method also comprises removing the first upgradeable front-end from the test set, installing a second upgradeable front-end into the test set, wherein the second upgradeable front-end has greater functionality than the first upgradeable front-end, and coupling the signal generation portion of the test set to the electrical power distribution equipment unit. The method also comprises inputting the test control parameter into the second upgradeable front-end of the test set and transmitting a second test signal from the signal generation portion of the test set to the electrical power distribution equipment based on the test control parameter input into the second upgradeable front-end. The method also comprises analyzing a second response to the second test signal received by the signal generation portion of the test set from the electrical power distribution equipment to determine a second test result, and displaying the second test result on the second upgradeable front end.

In yet another embodiment, a plurality of upgradeable front-ends is provided. Each upgradeable front-end is configured to be removeably coupled to a circuitry portion of a test set to promote testing electrical equipment. The first front-end has a numeric keypad for inputting test control parameters. The second front-end has a QWERTY keyboard for inputting test control parameters and a first sized display. The third front-end has a QWERTY keyboard for inputting test control parameters into a forms interface and a second sized display, wherein the second sized display is bigger than the first sized display.

These and other features will be more clearly understood from the following detailed description taken in conjunction with the accompanying drawings and claims.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

DETAILED DESCRIPTION

Figure 1:
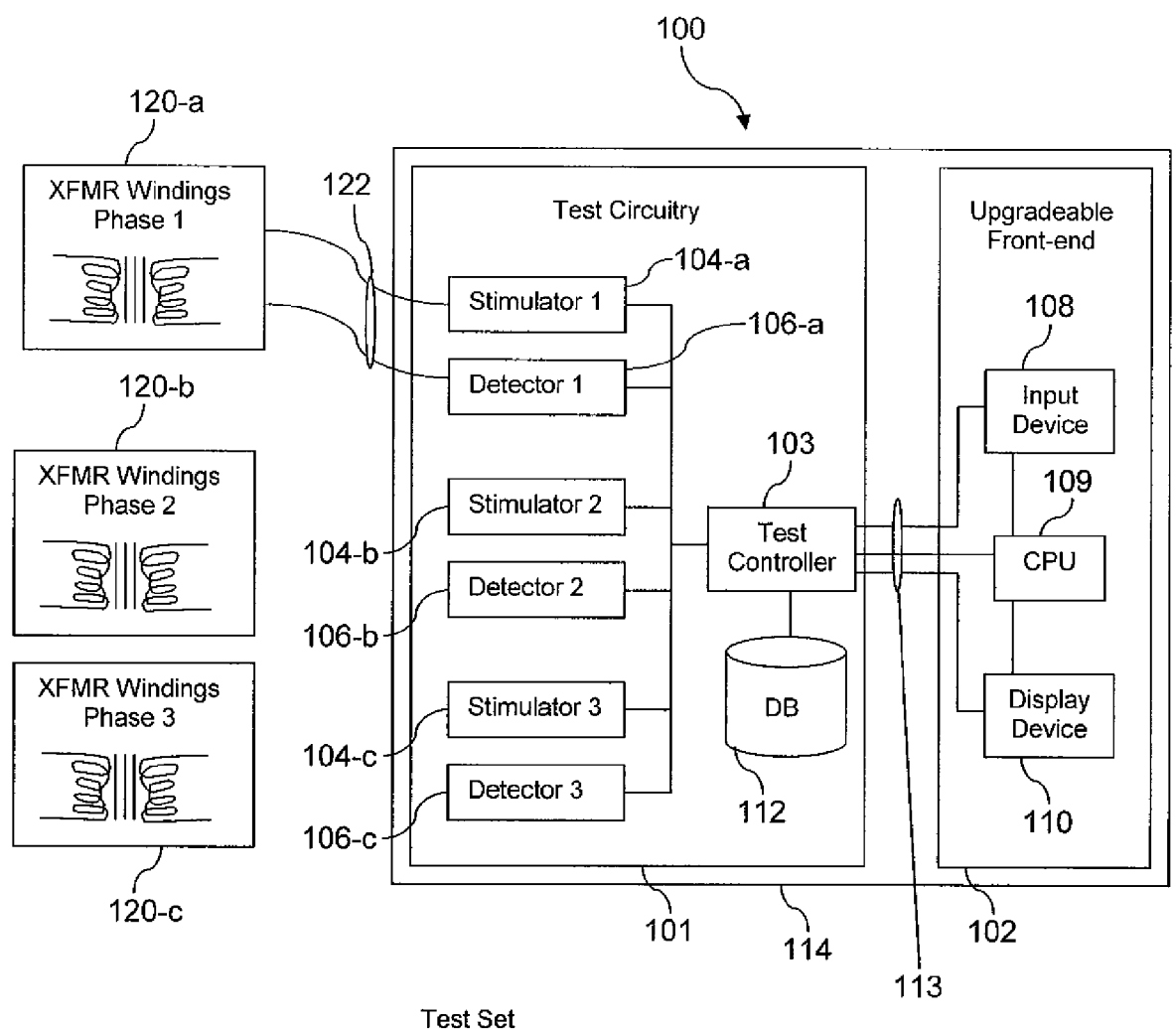
FIG. 1 illustrates an upgradeable test set according to an embodiment of the disclosure.

It should be understood at the outset that although illustrative implementations of one or more embodiments are illustrated below, the disclosed systems and methods may be implemented using any number of techniques, whether currently known or in existence. The disclosure should in no way be limited to the illustrative implementations, drawings, and techniques illustrated below, but may be modified within the scope of the appended claims along with their full scope of equivalents.

An upgradeable power distribution component test set is disclosed. The test set comprises a test circuitry portion of the test set and an upgradeable front-end portion of the test set.

The test circuitry portion of the test set stimulates a power distribution component under test with a known stimulation signal, detects the response of the component to the known stimulation signal, analyzes the response based on the known stimulation signal, and determines test results as measured values of component parameters. In an alternative embodiment, however, the upgradeable front-end portion of the test set may be responsible for analyzing the response of the component and determining test results.

In an embodiment, the test set further includes a database of test results determined during earlier and current testing. In one embodiment, the database may be stored in the test circuitry portion of the test set, but in other embodiments, the database may be stored in the upgradeable front-end portion of the test set. The database may be used to perform trend analysis of component parameters over time, for example predicting a future date that the component will first fail to meet specifications or predicting a future date of failure.

The upgradeable front-end portion of the test set includes a user interface for controlling testing operations and for visualizing and reporting test results. The upgradeable front-end portion of the test set is designed to be removeably coupled to a case enclosing the test set and/or to the test circuitry portion and to be replaced in the field with another upgradeable front-end portion. Different upgradeable front-ends may provide different kinds of functionality and may be priced at different pricing levels. The different kinds of functionality may be referred to as different levels of functionality. Different levels of functionality may be based on the different input devices, different displays, different processors, and different software applications. The different input devices, different displays, different processors, and different software applications may be associated with different capabilities. A more powerful processor, a processor executing more instructions per unit of time or executing more extensive instructions for example, may provide more capabilities or functionality than a less powerful processor.

In an embodiment, the test circuitry portion of the test set may include functionality or capability that remains inactive or dormant when coupled to an upgradeable front-end that is not configured to invoke or use that functionality or capability. When a less capable upgradeable front-end that is not able to use the dormant capability is replaced by a more capable upgradeable front-end that does make use of the dormant capability, the dormant capability may be enabled and invoked. In other embodiments, certain capabilities enabled on the higher end devices may actually be physically provided on the lower end systems, but not enabled until the front-end is upgraded.

The upgradeable test set may provide marketing advantages to the manufacturer of the upgradeable test set and may provide budget management advantages to the testing service provider and/or the power distribution company. The manufacturer of the upgradeable test set may be able to sell higher valued products or a greater aggregate product value over time by offering an entry level upgradeable test kit product that the customer can then upgrade later. The upgradeable test set may promote customer retention as well, because rather than replace the upgradeable test set with a new highly featured test set offered by a competitor the customer may prefer to purchase an upgradeable front-end portion that provides new features that are approximately equivalent to the competitor's product but at a lower purchase price since only the front-end portion is being purchased and not the test circuitry portion of the test set.

The upgradeable test set may provide advantages to testing service providers and/or power distribution companies which purchase the upgradeable test set. Capital equipment budgets may be allocated on an annual basis, and the upgradeable test set may permit the distribution of capital equipment costs over multiple years. For example, a basic upgradeable test set may be purchased for a low initial cost in a first year and a highly featured, deluxe upgradeable front-end portion may be purchased at an additional cost in a second year. The cost of the upgradeable test set with the deluxe upgradeable front-end portion may have been prohibitive as a single year capital expense but may be acceptable when the capital cost is distributed across two years as described.

Turning now to FIG. 1, an upgradeable test set 100 is described. The test set 100 comprises a test circuitry portion 101 and an upgradeable front-end portion 102. The test circuitry portion 101 comprises three stimulator circuits 104—a first stimulator circuit 104-a, a second stimulator circuit 104-b, and a third stimulator circuit 104-c. The test circuitry portion 101 further comprises three detector circuits 106—a first detector circuit 106-a, a second detector circuit 106-b, and a third detector circuit 106-c. In some embodiments, the stimulator circuits 104 may be integrated with the detector circuits 106. In some embodiments, the number of stimulator circuits 104 may be different from the number of detector circuits 106. For example, in an embodiment the test circuitry portion 101 may comprise three stimulator circuits 104 and only one detector circuit 106. Alternatively, in another embodiment the test circuitry portion 101 may comprise only one stimulator circuit 104 and three detector circuits 106. In an embodiment, the test circuitry portion 101 also comprises a test controller 103, but in another embodiment the test controller 103 may be located in the upgradeable front-end portion 102. In an embodiment, the test circuitry portion 101 includes a test results database 112. In other embodiments, however, the test results database 112 may be included as part of the upgradeable front-end portion 102.

The upgradeable front-end portion 102 comprises an input device 108, a processor 109, and a display device 110. The upgradeable front-end portion 102 is coupled to the test circuitry portion 101. In an embodiment, the upgradeable front-end portion 102 is coupled to the test circuitry portion 101 by an upgrade harness 113. In another embodiment, however, the upgradeable front-end portion 102 is coupled to the test circuitry portion 101 by mating socket connector and plug connector, or the like. Other couplings between the test circuitry portion 101 and the upgradeable front-end portion 102 are contemplated, and all of these are within the scope and spirit of the present disclosure. The coupling between the upgradeable front-end portion 102 and the test circuitry portion 101 promotes communication between the upgradeable front-end portion 102 and the test circuitry portion 101, for example the exchange of messages and electrical signals. The test set 100 is enclosed within a case 114 that may include electrical shielding.

The test circuitry portion 101 may be connected to a first transformer winding 120-a using a harness 122. A variety of harness configurations are possible, all of which are contemplated by the present disclosure. Three separate harnesses 122 may be employed to connect the first stimulator circuit 104-a and the first detector circuit 106-a to the first transformer winding 120-a, to connect the second stimulator circuit 104-b and the second detector circuit 106-b to a second transformer winding 120-b, and to connect the third stimulator circuit 104-c and the third detector circuit 106-c to a third transformer winding 120-c.

Alternatively, the three transformer windings may be tested independently, one winding after the other. For example, the harness 122 may be connected to the first transformer winding 120-a, to the first stimulator circuit 104-a, and to the first detector circuit 106-a, and the first transformer winding 120-a may then be tested. Thereafter the harness 122 may be disconnected from the first transformer winding 120-a, from the first stimulator circuit 104-a, and from the first detector circuit 106-a, connected to the second transformer winding, to the second stimulator circuit 104-b, and to the second exciter 106-b, and the second transformer winding 120-b may then be tested. Thereafter the harness 122 may be disconnected from the second transformer winding 120-b, from the second exciter 104-b, from the second detector circuit 106-b, and connected to the third transformer winding 120-c, to the third exciter 104-c, and to the third detector circuit 106-c, and the third transformer winding 120-c may then be tested.

In another embodiment, a single harness may provide all connections and cabling necessary to connect all three stimulator circuits 104 and all three detector circuits 106 to three transformer windings 120. While three separate transformer windings 120 are depicted in FIG. 1, the test set 100 is operable to test transformers having other numbers of transformer windings 120 and other configurations of transformer windings 120. A wide variety of power distribution transformer configurations are known, and the test set 100 is operable to test many or all of these power distribution transformer configurations.

Each stimulator circuit 104 stimulates or excites the power distribution component under test. For example, the first stimulator circuit 104-a may generate a direct current (DC) voltage stimulation signal to stimulate the first transformer winding 120-a. In an embodiment, the stimulator circuit 104 may be capable of outputting a current stimulation signal of up to about 500 mA. In an embodiment, the stimulator circuit 104 may be capable of outputting test voltages of about 80 Vrms, about 40 Vrms, and about 8 Vrms, when the current output is within operational limits. In another example, the first stimulator circuit 104-a may generate an alternating current (AC) voltage signal that sweeps across a range of frequencies to stimulate the first transformer winding 120-a. Many other stimulation signals may be generated by the stimulator circuits 104, all of which are contemplated by the present disclosure. The stimulation signals may also be referred to as test signals.

Each detector circuit 106 detects, records, or measures the response of the transformer winding 120 to the stimulation signal output by the stimulator 104. For example, the first detector circuit 106-a detects the response of the first transformer winding 120-a to the stimulation signal output by the first stimulator circuit 104-a. The detector circuit 106 may include one or more analog-to-digital converters to periodically capture the voltage and/or current of an output of the transformer winding and other circuitry to store the digital values in a memory. In an embodiment, the detector circuit 106 may include other circuitry or processing functionality to analyze the captured response to determine a test result parameter, for example a resistance of the transformer winding 120, an impedance of the transformer winding 120, a frequency response of the transformer winding 120, a turns ratio of the transformer winding 120, a power factor of the transformer winding 120, and others. Alternatively, in another embodiment, the detector circuit 106 provides unprocessed data to the test controller 103, and the test controller 103 analyzes the unprocessed data to determine the test result parameter.

The test controller 103 conducts the test of the power distribution transformer by controlling the stimulator circuits 104 and the detector circuits 106. The upgradeable front-end 102 receives one or more inputs defining values of test control parameters and transmits the test control parameter values to the test circuitry portion 101. For example, the input device 108 receives inputs into a form interface displayed on the display device 110. The processor 109 maps the input to one or more test control parameter values and sends the test control parameter values to the test controller 103 via the upgrade harness 113. The test controller 103 uses the test control parameter values received from the processor 109 to command the stimulator circuits 104. The test controller 103 also receives inputs to command test state transitions, for example a start command, a stop command, a repeat command, and other such commands. The test controller 103 may access the test results database 112 to store results of testing and to read test results from earlier tests.

In an embodiment, the function of the test controller 103 is performed by the processor 109 and there is no test controller 103 installed in the test circuitry portion 101. In an alternative embodiment, the function of the processor 109 is performed by the test controller 103 and there is no processor installed in the upgradeable front-end portion 102. In an embodiment, different upgradeable front-end portions 102 are associated with processors 109 having different capabilities and executing software promoting different levels of testing functionality or test results presentation. In an embodiment, the processor 109 may be referred to as the test controller, for example when there is no test controller 103 located in the test circuitry portion 101. For example, a first upgradeable front-end portion 102 may support a static input menu while a second upgradeable front-end portion 102 may support a dynamic, user modifiable forms interface.

In an embodiment, the upgradeable front-end 102 may be removeably coupled to the case 114 and/or the test circuitry portion 101, as opposed to a unitary construction where the upgradeable front-end 102 is integral with the case 114 and/or the test circuitry portion 101. The upgradeable front-end 102 may be removeably coupled to the case 114 and/or the test circuitry portion 101 with any of a variety of fasteners including screws, nuts and bolts, clips, latches, retaining rings, cotter pin, and others well known in the art. The upgradeable front-end 102 may be removeably coupled to the case 114 and/or the test circuitry portion 101 by tension fittings, or the like. The upgradeable front-end 102 may be matingly or otherwise coupled to the case 114 and/or the test circuitry portion 101 to be removeably secured to the case 114 and/or the test circuitry portion 101. Once released, the upgradeable front-end 102 is designed to be readily disconnected from the upgrade harness 113 and a different upgradeable front-end 102 installed, including connecting the different upgradeable front-end 102 to the upgrade harness 113. The different upgradeable front-end 102 may then be secured in place by reengaging the fasteners.

The upgradeable front-end 102 may be replaced in a standard shop environment. A standard shop environment may be provided either in an equipment shop of a testing service company and/or in an equipment shop of a power distribution company. In an embodiment, it is contemplated that the upgradeable front-end 102 may be replaced using standard commonly available tools such as a screw driver and pliers on an ordinary benchtop. This kind of easy, straightforward replacement operation may be referred to as field replaceable, or removeably coupled. In an embodiment, the replacement procedures do not require specially trained technicians or custom or special order tools provided by the manufacturer of the upgradeable test set 100. The upgradeable front-end 102 may be replaced at the test location in proximity to the power distribution component. The upgradeable front-end 102 need not be returned to the manufacturer to accomplish replacement of the upgradeable front-end 102.

The input device 108 may be a keyboard and/or keypad and/or touchscreen. The input device 108 may also comprise one or more switches and/or pushbuttons. The display device 110 may be a flat panel display, a liquid crystal display (LCD), or other display. In an embodiment, the input device 108 comprises a QWERTY or other keyboard configuration, including roman numeral keys 1 through 9 and 0, a test button, a five button navigation pad, a home key, a zone key, a power suspend key, a help function key, an information key, and a function key. The QWERTY keyboard is used for entry of alphanumeric and other input, for example data and notes. The test button is used to initiate and terminate testing. The five button navigation pad is used to move a display cursor left/right and up/down and to activate a selection, for example to navigate through cells or fields of a test form. The zone key selects an active region of the display device 110. The help function key selects on-screen Help to assist an operator of the test set 100. The information key selects on-screen information to assist an operator of the test set 100. The function key displays the options available for any selection highlighted on the display device 110. In other embodiments, however other input functions and other input keys, switches, or devices may be used by the test set 100.

In an embodiment, in a first level upgradeable front-end 102, the display device 110 is a text based display and the input device 108 is a numeric keypad. The display device in the first level upgradeable front-end 102 may display options or commands that are selectable from the numeric keypad. The first level upgradeable front-end 102 provides an RS-232 serial interface. In an embodiment, in a second level upgradeable front-end 102, the display device 110 is a 5.7 inch color VGA display and the input device 108 is a QWERTY keyboard. The second level upgradeable front-end 102 provides a universal serial bus (USB) port and an Ethernet port. The second level upgradeable front-end 102 also provides a database for containing historical records of tests, for example the database 112. The second level upgradeable front-end 102 incorporates a personal computer executing an intermediate capability operating system. In an embodiment, in a third level upgradeable front-end 102, the display device 110 is an 8.4 inch color VGA display and the input device 108 is a QWERTY keyboard. The third level upgradeable front-end 102 provides two USB ports and an Ethernet port. The third upgradeable front-end 102 also provides a database including trending, for example the database 112. The third level upgradeable front-end 102 incorporates a personal computer executing a high-end capability operating system. The third level upgradeable front-end 102 also provides a forms-based test control interface. While three exemplary levels of front-end capabilities have been described above, other or different arrangements of capabilities distributed among different levels of upgradeable front-ends 102 are within the scope and spirit of the present disclosure. Additionally, either fewer or more different levels of upgradeable front-ends 102 are contemplated. In some embodiments, the different levels of upgradeable front-ends 102 may feature different systems or amounts of various capabilities, such as but not limited to, different storage and/or memory types or sizes and/or faster processors 109.

The case 114 is a ruggedized plastic case that is designed to absorb and dampen mechanical disturbances, for example bumps or jars from metal tools or falls onto concrete. The case 114 may include electrical shielding to protect the components of the test set 100 from the strong electromagnetic fields and/or electric fields that may be experienced at power distribution locations. The case 114 is designed to contain the harness 122 when closed. In an embodiment, a lid of the case 114 may be removable to promote ease of access in the field.

The test set 100 may be coupled to local AC power, for example 120 VAC power or 220 VAC power. The test set 100 may be coupled to a printer at the test location, in the field, to print out test results on location, while the test set 100 remains coupled to the power distribution component under test. This may have multiple benefits, including providing the operator of the test set 100 with an opportunity to carefully review the test results to assure that the test has completed and all essential test result parameters have been determined. If some test result parameters remain undetermined, the operator may resume and complete the test. This may save time, money, and damaged business relationships versus needing to schedule a follow-up test. Additionally, the power distribution operating company may prefer to have the record of the test entered into their notebooks or logs immediately.

It will be appreciated by one skilled in the art that while the current system is described as configured for testing power distribution transformers, other configurations of the current system could be used for testing other components, for example batteries, protection relays, generators, electrical motors, and others, in some cases after making appropriate modifications to stimulator circuits 104 or detector circuits 106 or test controller 103. Based on the present disclosure, other configurations of the current system to support testing other components will readily suggest themselves to one skilled in the art, and these other configurations are contemplated by the present disclosure.

Figure 2:
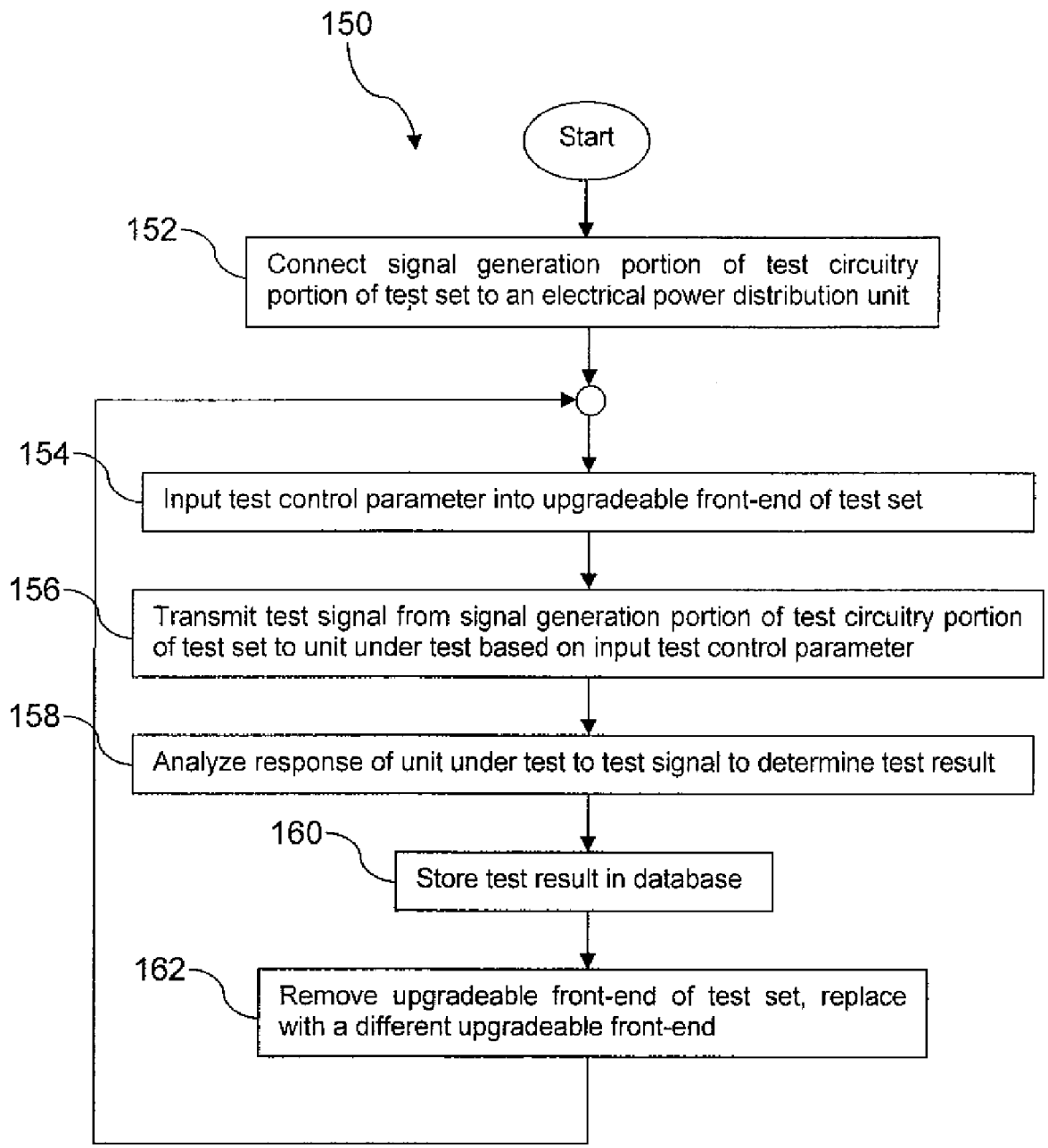
FIG. 2 is a flow diagram of a method of testing a power distribution component according to an embodiment of the disclosure.

Turning now to FIG. 2, a method 150 of testing an electrical power distribution component using the upgradeable test set 100 is described. At block 152, the upgradeable test set 100 is coupled to the electrical power distribution component under test. For example, the test circuitry portion 101 of the upgradeable test set 100 is connected to the transformer winding 120 using the harness 122. The harness 122 may connect the stimulator 104 and/or the detector 106 to the transformer winding 120. In an embodiment, the upgradeable test set 100 may be coupled to different kinds of electrical power distribution component, for example a generator winding, a generator exciter winding. In an embodiment, the upgradeable test set 100 may be coupled to a motor winding.

In block 154, a test control parameter is input to the upgradeable front-end 102. Depending on the kind of upgradeable front-end 102 installed, the input may be keyed in using a numeric keypad or using a QWERTY keyboard. In one upgradeable front-end 102, a QWERTY keyboard is used to enter the input into a forms interface.

At block 156, the test control parameter input is used to command the stimulator 104 to transmit a test signal to the unit under test. A variety of test signals may be transmitted, depending upon the kind of unit under test and the kind of test being performed. A test signal associated with determining a transformer turns ratio of a winding may be transmitted. A test signal associated with determining a resistance of a transformer winding, a generator winding, or a motor winding may be transmitted. A test signal associated with determining a frequency response of a transformer winding, a generator winding, or a motor winding may be transmitted. Alternatively, a different test signal may be transmitted.

At block 158, the response of the unit under test to the test signal is analyzed to determine a test result. The test result may be a resistance value of a winding, a transformer turns ratio, a frequency response of a winding, or some other parameter value. The analysis may be performed by the detector circuits 106, by the test controller 103, by the processor 109, or by some other component or combination of components of the upgradeable test set 100. At block 160, the test result is optionally stored in the database 112.

At block 162, the upgradeable front-end 102 of the upgradeable test set 100 is removed and replaced by a different upgradeable front-end 102. For example, a first upgradeable front-end 102 having a numeric keypad input device 108 is replaced by a second upgradeable front-end 102 having a QWERTY keyboard input device 108 and a 5.7 inch color VGA display device 110. Alternatively, a second upgradeable front-end 102 having a QWERTY keyboard input device 108 and a 5.7 inch color VGA display device 110 may be replaced by a third upgradeable front-end 102 having a QWERTY keyboard input device 108 and an 8.4 inch color VGA display device 110, wherein the input of test control parameters may be provided using a forms interface. It is understood that the display sizes identified above are exemplary and that other sizes of displays, either smaller or larger, may be associated with the different upgradeable front-ends 102. In an embodiment, removing and replacing the upgradeable front-end 102 may also involve enabling additional capability or capabilities of the test circuitry portion 101 of the upgradeable test set 100, for example enabling dormant capabilities built-into the test circuitry portion 101 of the upgradeable test set 100 which could not be accessed or invoked by the previously installed upgradeable front-end 102 that can be accessed and invoked by the currently installed upgradeable front-end 102.

After the replacement of the upgradeable front-end 102, which may be referred to as upgrading the test set 100, the testing of the unit under test may be repeated, for example by returning to block 154. In some circumstances, after upgrading the test set 100 the method 150 may return to block 152, for example a period of some weeks or months after the completion of the previous testing of the electrical power distribution component.

In an embodiment, at block 158, the analyzing the response of the unit under test may include comparing a current test result with one or more test results recorded earlier in the database 112, for example during a previous test of the electrical power distribution component. The analysis may project a trend of one or more parameters of the electrical power distribution component, for example projecting a time when one of the parameters will be out of operational limits or out of preferred operational condition. The data may be retained in the test circuitry portion 101 of the upgradeable test set 100, making the history of previous test results accessible across change-outs of the upgradeable front-end 102.

In an embodiment, when the replacement of the upgradeable front-end 102 enables capabilities or functionality that were previously dormant or inactive in the test circuitry portion 101, the functionality of the blocks 154, 156, 158, and 160 may change accordingly, to take advantage of or to invoke the dormant capabilities of the test circuitry portion 101 which have been enabled. In this case, the test result determined or the display of the test results may change accordingly.

Figure 3:
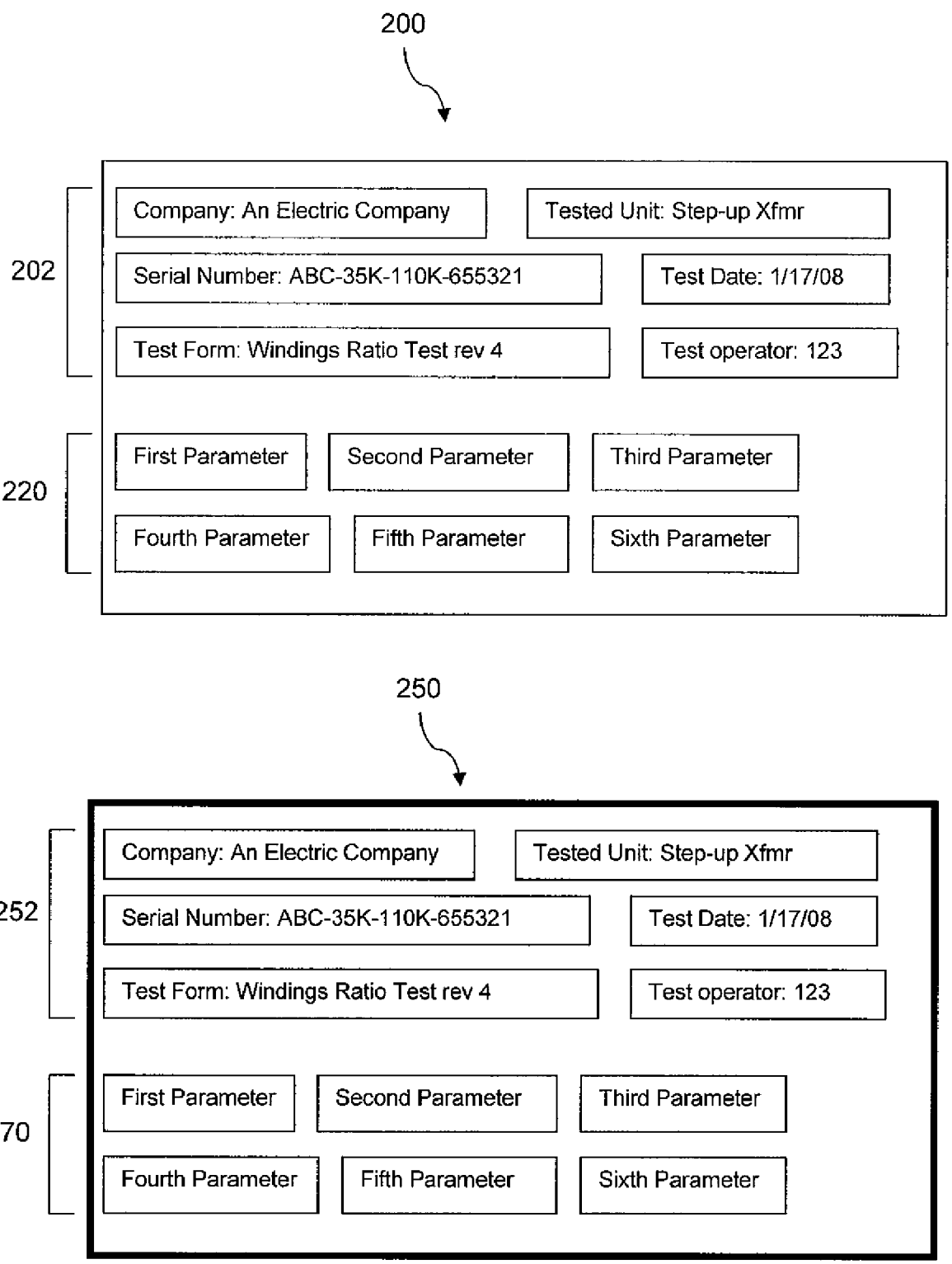
FIG. 3 is illustrates an exemplary graphical user interface and a report associated with a form displayed on the graphical user interface.

Turning now to FIG. 3, an exemplary graphical user interface (GUI) 200 containing a form and a report 250 associated with the form are discussed. The form displayed in the GUI may contain contextual information 202 related to a test operation, for example a name of the company that owns the equipment under test, a name or type of equipment under test, a serial number of the equipment under test, a test date, a name or other identification of the test form used to conduct the test, and the name or identification number of the operator conducting the test. The form may also contain a plurality of parameters 220. Some of the parameters may be input parameters or control parameters. The control parameters provide information that may be used to adjust or control the test, for example defining for the test controller 102 how to command the stimulator circuits 104. Some of the parameters may be output parameters or results parameters. The results parameters may provide the measured values of the response of the equipment under test to the stimulation signals applied. The results parameters may be determined by the test controller 102 by analyzing a plurality of measured values, for example to determine a transformer winding turns ratio.

The report 250 represents an output of the test set 100, for example a printed report. The report 250 is substantially a duplicate of the contents of the GUI 200. The report 250 may be scaled in dimensions to be printed on standard sized papers, but contains the same information displayed in the GUI 200. For example, the report 250 contains contextual information 252 that corresponds substantially to the contextual information 202 shown in the GUI 200. The report 250 also contains a plurality of parameters 270 that correspond substantially to the parameters 220.

In some embodiments, other contextual information 202, 252 may be provided by the GUI 200 and the report 250. In some embodiments, other parameters 220, 270 may be provided by the GUI 200 and the report 250. In an embodiment, the GUI 200 and the report 250 may provide trend information related to one or more of the parameters 220, 270. The trend information may indicate a rate of change of the parameters or may be represented as a graph of the parameter or parameters versus time, showing the trend as a trend-line on the graph.

The report 250 may be printed out at the field location where the testing operation is performed, for example using a portable printer coupled to the test set 100. If portions of a test or key parameter values are missing, printing the report 250 while still at the field location may promote discovery of the incompleteness of the test while still on location when the test may be easily repeated and completed.

The form displayed in the GUI 200 is readily modified using the test set 100. For example, different contextual information 202, 252 may be preferred by different electric companies. Different test procedures may be preferred by different electric companies. The form displayed in the GUI 200 may be modified accordingly.

Figure 4:
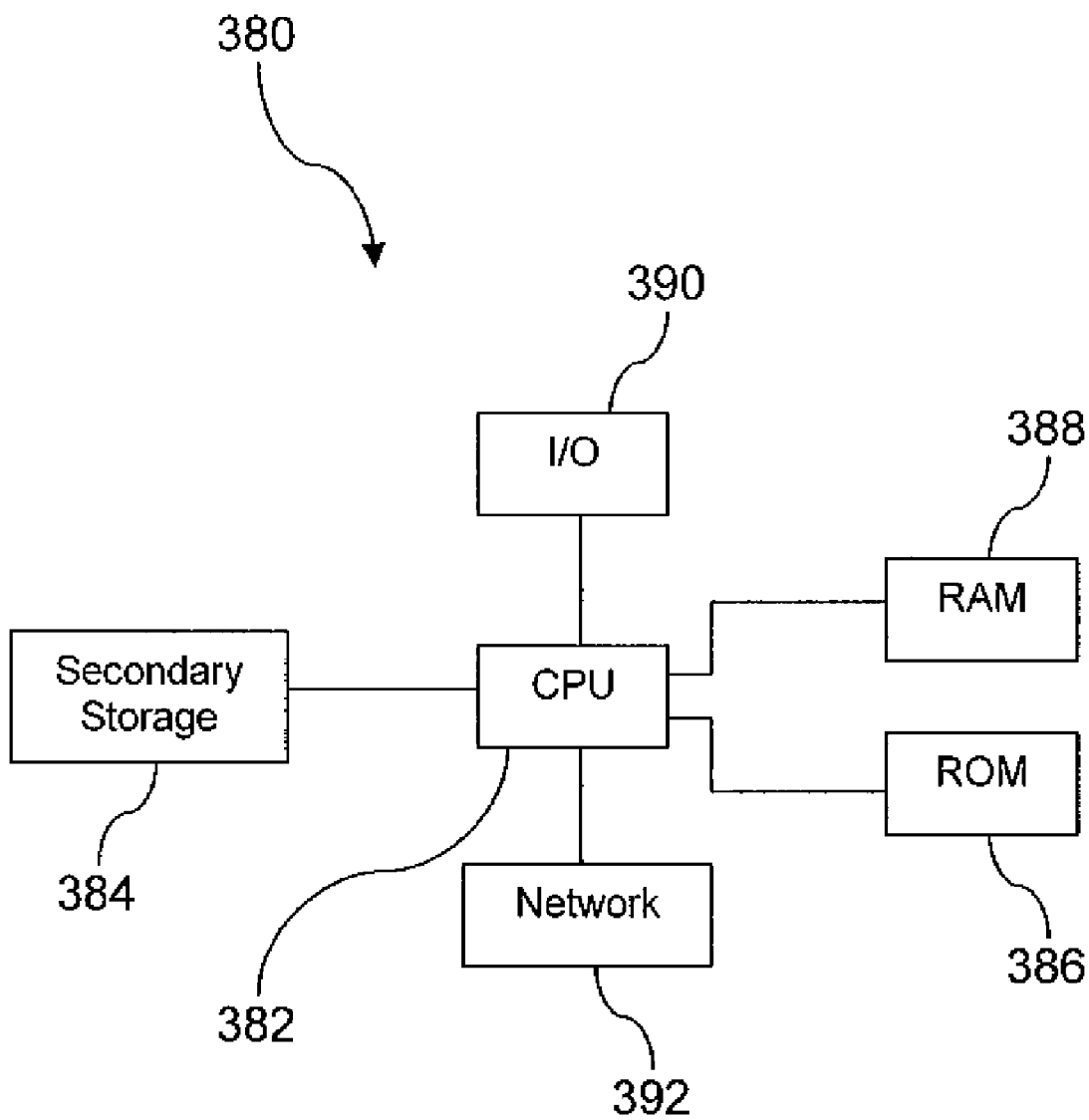
FIG. 4 illustrates an exemplary general purpose computer system suitable for implementing at least portions of the several embodiments of the disclosure.

FIG. 4 illustrates a typical, general-purpose computer system 380. Portions of the upgradeable test set 100 described above may be implemented using the general-purpose computer 380 with sufficient processing power, memory resources, and network throughput capability to handle the necessary workload placed upon it and with appropriate mechanical and electrical shielding to protect the general-purpose computer from the harsh environment of the power distribution field environment. The computer system 380 includes a processor 382 (which may be referred to as a central processor unit or CPU) that is in communication with memory devices including secondary storage 384, read only memory (ROM) 386, random access memory (RAM) 388, input/output (I/O) devices 390, and network connectivity devices 392. The processor may be implemented as one or more CPU chips.

The secondary storage 384 is typically comprised of one or more disk drives or tape drives and is used for non-volatile storage of data and as an over-flow data storage device if RAM 388 is not large enough to hold all working data. Secondary storage 384 may be used to store programs which are loaded into RAM 388 when such programs are selected for execution. The ROM 386 is used to store instructions and perhaps data which are read during program execution. ROM 386 is a non-volatile memory device which typically has a small memory capacity relative to the larger memory capacity of secondary storage. The RAM 388 is used to store volatile data and perhaps to store instructions. Access to both ROM 386 and RAM 388 is typically faster than to secondary storage 384.

I/O devices 390 may include printers, video monitors, liquid crystal displays (LCDs), touch screen displays, keyboards, keypads, switches, dials, mice, track balls, voice recognizers, card readers, paper tape readers, or other well-known input devices.

The network connectivity devices 392 may take the form of modems, modem banks, ethernet cards, universal serial bus (USB) interface cards, serial interfaces, token ring cards, fiber distributed data interface (FDDI) cards, wireless local area network (WLAN) cards, radio transceiver cards such as code division multiple access (CDMA) and/or global system for mobile communications (GSM) radio transceiver cards, and other well-known network devices. These network connectivity devices 392 may enable the processor 382 to communicate with an Internet or one or more intranets. With such a network connection, it is contemplated that the processor 382 might receive information from the network, or might output information to the network in the course of performing the above-described method steps. Such information, which is often represented as a sequence of instructions to be executed using processor 382, may be received from and outputted to the network, for example, in the form of a computer data signal embodied in a carrier wave Such information, which may include data or instructions to be executed using processor 382 for example, may be received from and outputted to the network, for example, in the form of a computer data baseband signal or signal embodied in a carrier wave. The baseband signal or signal embodied in the carrier wave generated by the network connectivity devices 392 may propagate in or on the surface of electrical conductors, in coaxial cables, in waveguides, in optical media, for example optical fiber, or in the air or free space. The information contained in the baseband signal or signal embedded in the carrier wave may be ordered according to different sequences, as may be desirable for either processing or generating the information or transmitting or receiving the information. The baseband signal or signal embedded in the carrier wave, or other types of signals currently used or hereafter developed, referred to herein as the transmission medium, may be generated according to several methods well known to one skilled in the art.

The processor 382 executes instructions, codes, computer programs, scripts which it accesses from hard disk, floppy disk, optical disk (these various disk based systems may all be considered secondary storage 384), ROM 386, RAM 388, or the network connectivity devices 392. While only one processor 392 is shown, multiple processors may be present. Thus, while instructions may be discussed as executed by a processor, the instructions may be executed simultaneously, serially, or otherwise executed by one or multiple processors.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. An upgradable test set, comprising:
    a stimulator circuit to transmit test signals to an electrical equipment unit under test;
    a coupling to removeably couple at least the stimulator circuit to one of a plurality of front-end interfaces, the coupling configured to removeably receive at least:
        a first front-end interface having a first display and a first input device, or
        a second front-end interface having a second display and a second input device, wherein the first display and the second display have different display characteristics and the first input device and the second input device have different characteristics,
    wherein a test control parameter is communicated from the one of the front-end interfaces to the stimulator circuit and a response of the electrical equipment under test is communicated to the one of the front-end interfaces; and
    a case configured to house the stimulator circuit, one of the front-end interfaces, and the coupling.

2. The upgradeable test set of claim 1, wherein the stimulator circuit transmits test signals to one of an electrical power distribution transformer, an electrical power generator, and an electrical motor.

3. The upgradeable test set of claim 1, wherein the first front-end interface has a first database to store the response and the second front-end interface has a second database to store the response, the first and second databases being different databases.

4. The upgradeable test set of claim 1, further including a database storing the response, wherein the stimulator circuit and the database are built into a test circuitry portion of the test set and wherein the coupling removeably couples the one of the front-end interfaces to the test circuitry portion of the upgradeable test set.

5. The upgradeable test set of claim 4, wherein the first front-end interface has a first test controller to receive the test control parameter, to command the stimulator circuit based on the test control parameter, to receive the response, to analyze the response, and to present the results of analyzing the response on the first display and wherein the second front-end interface has a second test controller to receive the test control parameter, to command the stimulator circuit based on the test control parameter, to receive the response, to analyze the response, and to present the results of analyzing the response on the second display.

6. The upgradeable test set of claim 1, wherein the plurality of front-end interfaces correspond to different levels of functionality.

7. A power distribution equipment test set, comprising:
    a test signal generator to transmit known test signals to equipment under test, the test signal based on a test control parameter;
    a first control panel removeably coupled to the test signal generator, wherein the first control panel receives inputs including the test control parameter, sends the test control parameter to the test signal generator, and displays test results; and
    a second control panel such that, when the second control panel is removeably coupled to the test signal generator in the place of the first control panel, the second control panel receives inputs including the test control parameter, sends the test control parameter to the test signal generator, and displays test results, the second control panel having an improved display in relation to the first control panel.

8. The power distribution equipment test set of claim 7, wherein the test signal generator transmits one of a transformer turns ratio test signal, a transformer winding resistance test signal, and a transformer winding frequency analysis test signal.

9. The power distribution equipment test set of claim 7, wherein the first control panel has a numeric keypad and the second control panel has a QWERTY keyboard.

10. The power distribution equipment test set of claim 7, further including:
    a third control panel such that, when the third control panel is removeably coupled to the test signal generator in the place of the first control panel and the second control panel, the third control panel receives inputs including the test control parameter, sends the test control parameter to the test signal generator, and displays test results, the third control panel having an improved display in relation to the first control panel and the second control panel.

11. The power distribution equipment test set of claim 10, wherein the third control panel provides a forms interface for receiving the inputs including the test control parameter.

12. The power distribution equipment test set of claim 10, wherein the first control panel, the second control panel, and the third control panel are field replaceable.

13. The power distribution equipment test set of claim 12, wherein the first control panel, the second control panel, and the third control panel are replaceable in a standard shop environment.

14. A method of testing an electrical power distribution equipment, comprising:
    coupling a signal generation portion of a test set to an electrical power distribution equipment unit;
    inputting a first test control parameter into a first upgradeable front-end of the test set;
    transmitting a first test signal from the signal generation portion of the test set to the electrical power distribution equipment based on the first test control parameter input into the first upgradeable front-end;
    analyzing a first response to the first test signal received by the signal generation portion of the test set from the electrical power distribution equipment to determine a first test result;
    displaying the first test result on the first upgradeable front-end;
    removing the first upgradeable front-end from the test set;
    installing a second upgradeable front-end into the test set, wherein the second upgradeable front-end has additional functionality than the first upgradeable front-end;
    coupling the signal generation portion of the test set to the electrical power distribution equipment unit;
    inputting a second test control parameter into the second upgradeable front-end of the test set;

transmitting a second test signal from the signal generation portion of the test set to the electrical power distribution equipment based on the second test control parameter input into the second upgradeable front-end;

analyzing a second response to the second test signal received by the signal generation portion of the test set from the electrical power distribution equipment to determine a second test result; and displaying the second test result on the second upgradeable front-end.

15. The method of claim 14, further including enabling additional capability of the signal generation portion of the test set, wherein the second test result is based on the enabled additional capability.

16. The method of claim 14, further including:
storing the first test result in a database contained in the signal generation portion of the test set;
comparing the first test result stored in the database with the second test result to determine a trend of the first test result and the second test result; and
displaying the trend of the first test result and the second test result on the second upgradeable front end.

17. The method of claim 14, wherein the signal generation portion of the test set is coupled to at least a first winding of a power distribution transformer.

18. The method of claim 14, wherein the test signal transmitted by the signal generation portion of the test set is one of a transformer turns ratio test signal, a transformer winding resistance test signal, and a transformer winding frequency analysis test signal.

19. The method of claim 14, wherein the second upgradeable front-end provides a forms interface and wherein inputting the second control parameter comprises inputting the second control parameter into a form.

20. The method of claim 14, wherein the first upgradeable front-end provides a numeric keypad interface and inputting the first control parameter comprises activating the keys of the numeric keypad interface.

21. The method of claim 15, wherein displaying the second test result on the second upgradeable front-end is an improved display relative to displaying the first test result on the first upgradeable front-end.

22. A plurality of upgradeable front-ends, each upgradeable front-end configured to be removeably coupled to a circuitry portion of a test set to promote testing electrical equipment, comprising:
a first front-end having a numeric keypad for inputting test control parameters;
a second front-end having a QWERTY keyboard for inputting test control parameters and a first sized display; and
a third front-end having a QWERTY keyboard for inputting test control parameters into a forms interface and a second sized display, wherein the second sized display is improved relative to the first sized display.

23. The plurality of upgradeable front-ends of claim 22, wherein an operating system associated with the third front-end is more capable than an operating system associated with the second front-end.

24. The plurality of upgradeable front-ends of claim 22, wherein a processor associated with the third front-end is more capable than a processor associated with the second front-end.

* * * * *